United States Patent [19]

Mawatari et al.

[11] Patent Number: 5,200,847
[45] Date of Patent: Apr. 6, 1993

[54] LIQUID CRYSTAL DISPLAY DEVICE HAVING DRIVING CIRCUIT FORMING ON A HEAT-RESISTANT SUB-SUBSTRATE

[75] Inventors: Atsushi Mawatari, Hamura; Ichiro Ono, Hachioji, both of Japan

[73] Assignee: Casio Computer Co., Ltd., Tokyo, Japan

[21] Appl. No.: 691,215

[22] Filed: Apr. 25, 1991

[30] Foreign Application Priority Data

May 1, 1990 [JP] Japan ................................ 2-111811
May 1, 1990 [JP] Japan ................................ 2-111812

[51] Int. Cl.[5] .............................................. G02F 1/13
[52] U.S. Cl. ...................................... 359/59; 359/54; 359/82
[58] Field of Search ..................... 359/54, 55, 82, 85, 359/59; 340/714, 718, 719, 789; 357/4, 23.7, 59

[56] References Cited

U.S. PATENT DOCUMENTS

| | | | |
|---|---|---|---|
| 4,660,935 | 4/1987 | Iwashita et al. | 359/54 |
| 4,736,229 | 4/1988 | Holmberg et al. | 357/4 |
| 4,862,153 | 8/1989 | Nakatani et al. | 340/719 |
| 4,905,072 | 2/1990 | Komatsu et al. | 357/59 |
| 5,029,984 | 7/1991 | Adachi et al. | 359/88 |
| 5,076,667 | 12/1991 | Stewart et al. | 359/54 |

FOREIGN PATENT DOCUMENTS

| | | | |
|---|---|---|---|
| 63-307431 | 12/1988 | Japan . | |
| 1-281485 | 11/1989 | Japan . | |
| 0242230 | 9/1990 | Japan | 359/54 |
| 2166899 | 5/1986 | United Kingdom | 340/719 |

OTHER PUBLICATIONS

Patent Abstract of Japan, vol. 4, No. 1, Jan., 1990, Seiko Epson Corp., Liquid Crystal Display Device.
Molecular Crystals and Liquid Crystals, vol. 129, No. 1/3, 1985, London, England, Novel Thin-Film α-Si Approach to Drive Active Matrices Displays.
IEEE Transactions of Electron Devices, vol. 36, No. 9-I, Sep. 1989, New York, New York, Peripheral Circuit Integrated Poly-Si TFT LCD with Gray Scale Representation.

*Primary Examiner*—William L. Sikes
*Assistant Examiner*—Huy K. Mai
*Attorney, Agent, or Firm*—Frishauf, Holtz, Goodman & Woodward

[57] ABSTRACT

In a liquid-crystal display device of the present invention, a plurality of first electrodes arranged on a matrix, active elements respectively connected to the first electrodes, signal supplying lines for supplying driving signals to the active elements are formed on one of a pair of substrates opposing each other, at least one second electrode opposing the first electrodes is formed on the other substrate, the pair of substrates are bonded by a sealing member by keeping the predetermined gap therebetween, and liquid material is sealed between the substrates. A terminal portion extended beyond the sealing member is formed on the signal supplying line. A driving circuit comprising thin-film transistors made of a semiconductor having a crystal structure and formed on a heat-resistant substrate is electrically connected to each terminal portion of the supplying lines on the periphery of one of the substrates.

20 Claims, 5 Drawing Sheets

PRIOR ART

FIG.1

PRIOR ART

LIQUID CRYSTAL DISPLAY DEVICE HAVING DRIVING CIRCUIT FORMING ON A HEAT-RESISTANT SUB-SUBSTRATE

BACKGROUND OF THE INVENTION

1. Field of the Invention

The present invention relates to a liquid crystal display device in which a driving circuit for supplying driving signals to at least one of the opposing electrodes is installed on at least one substrate of liquid crystal display cells.

2. Description of the Related Art

A matrix-type liquid crystal display device for displaying television pictures comprises, an electrode for display formed on a pair of opposed glass substrates, and a liquid crystal layer sandwiched between a pair of substrates. The liquid crystal display device includes the simple matrix type and the TFT (thin film transistor) active matrix type. For the simple-matrix-type liquid-crystal display device, many striped scanning electrodes are arranged in parallel on one glass substrate and many striped signal electrodes orthogonal to the scanning electrodes are arranged in parallel on the other glass substrate.

For the TFT-active-matrix-type liquid-crystal display device, many pixel electrodes and thin film transistors (TFTs) for selecting each pixel electrode are arranged in rows and columns on one glass substrate and opposing electrodes are formed on the other glass substrate.

Recently, one of the matrix-type liquid-crystal display devices has been proposed in which the display driving circuit is installed on the terminal arranged portion of the glass substrate.

Figure 1:
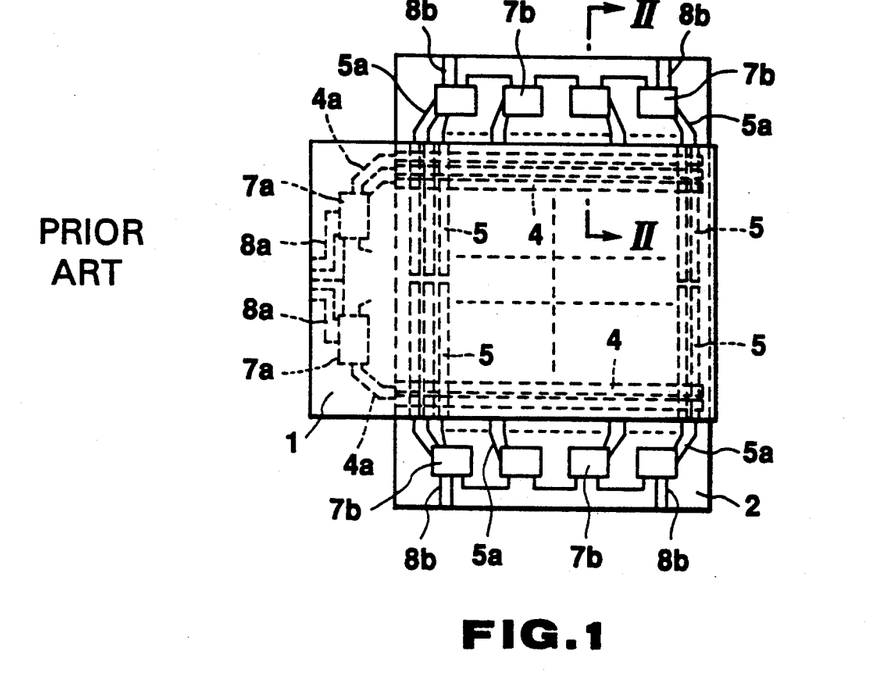
FIG. 1 is a top view showing a prior art of the liquid-crystal display device having driving circuit.
Figure 2:
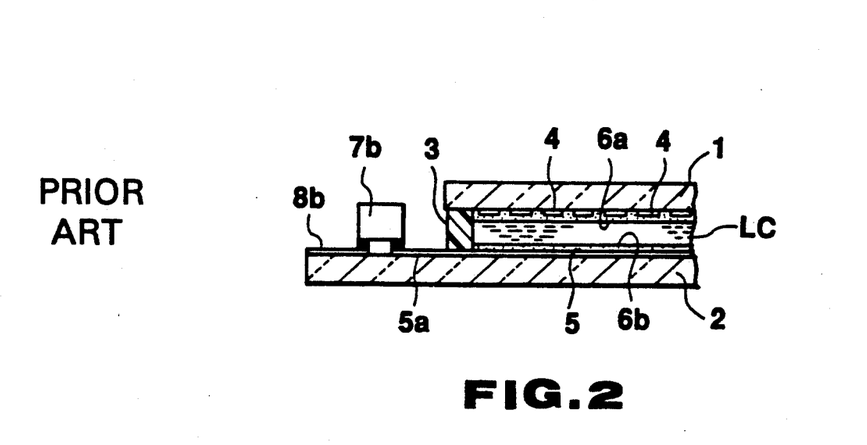
FIG. 2 is a sectional view of the liquid-crystal display device along the line II—II in FIG. 1.

FIGS. 1 and 2 show a simple-matrix-type liquid-crystal display device having the existing display driving circuit.

In FIGS. 1 and 2, a pair of glass substrates 1 and 2 faced at the both sides of a liquid crystal layer LC are bonded through the frame-shaped sealing member 3 enclosing the liquid crystal sealing area. Many striped scanning electrodes 4 (transparent electrodes) are arranged in parallel on the glass substrate 1 (upper substrate in the drawing) of the pair of glass substrates 1 and 2. Many striped signal electrodes 5 (transparent electrodes) orthogonal to the scanning electrodes 4 are arranged in parallel on the other glass substrate 2 (lower substrate in the drawing). In addition, orientation films 6a and 6b are formed on the surface where electrodes of the both substrates 1 and 2 are formed. For the liquid crystal display device, the signal electrodes 5 are separated at the middle in the longitudinal direction to individually drive each signal electrode 5 so that the display driving duty ratio will be decreased.

Several (two in the drawing) scanning driving circuit elements 7a are installed on one end of the glass substrate 1. Several (four in the drawing) signal driving circuit elements 7b are installed on both ends of the other glass substrate 2 respectively. The output terminal of each scanning driving circuit element 7a is installed by solder or the like on the end of a driving circuit connecting lead wire 4a which is extended from the end of each scanning electrode 4 and arranged on the surface of the glass substrate 1. The output terminal of each signal driving circuit element 7b is installed by solder or the like on the end of a driving circuit connecting lead wire 5a which is extended from the end of each signal electrode 5 and arranged on the surface of the glass substrate 2. Numeral 8a is an external-circuit connecting wire arranged on the surface of the glass substrate 1 and numeral 8b is an external-circuit connecting wire arranged on the surface of the glass substrate 2. The input terminals of the driving circuit elements 7a and 7b are connected by solder or the like with the external-circuit connecting wires 8a and 8b respectively. The driving circuit elements 7a and 7b use an IC chip in which many MOS-type transistors are formed on a single-crystal silicon substrate. The scanning and signal display driving circuits comprise several driving circuit elements (IC chip) 7a and 7b respectively. The existing active-matrix-type liquid-crystal display device includes two types: one is the type using a single crystal silicon substrate as each of the pair of substrates of the liquid crystal cell on which single-crystal MOS-type transistors made of single crystal silicon are formed as the selecting transistor for selecting a pixel electrode, and the other is the TFT active-matrix-type using thin film transistors (TFTs) as the selecting transistor for selecting a pixel electrode.

The active-matrix-type liquid-crystal display device using the single-crystal MOS-type transistor uses a silicon substrate made of single crystal silicon as either substrate on which the MOS-type selecting transistors are formed. Each pixel electrode of the active-matrix-type liquid-crystal display device is connected to the source electrode of each selecting transistor on the silicon substrate. The gate electrode and drain electrode of each selecting transistor are connected to many scanning lines and data lines which are orthogonally formed on the silicon substrate.

For the TFT active-matrix-type liquid-crystal display device using thin film transistors, many scanning lines and many data lines orthogonal to the scanning lines are formed on a glass substrate. A gate electrode, gate insulting film, semiconductor layer comprising amorphous silicon, and selecting transistor electrodes are formed at each intersection of the scanning and data lines. The gate electrode and drain electrode of each selecting thin-film transistor are connected to the scanning line and data line respectively, and the source electrode is connected to the pixel electrode formed on the glass substrate.

For every liquid-crystal display device shown above, opposing electrodes are formed on the opposing glass substrates.

For the active-matrix-type liquid-crystal display device using a single-crystal substrate as the one of the pair of substrates of liquid crystal cell, the display driving circuit comprises many single-crystal MOS-type transistors for a driver formed on the periphery of a line lead-out portion on the silicon substrate.

For the TFT active-matrix-type liquid-crystal display device, the scanning and signal display driving circuits are composed of several driving circuit elements consisting of IC chips respectively and each driving circuit element is installed on the periphery of either glass substrate forming the pixel electrodes and the thin film transistors for selectively driving them. For the TFT active-matrix-type liquid-crystal display device the terminal of each scanning driving circuit element is connected to the lead wire extended from the scanning line (gate line) connecting with the gate electrode of the thin film transistor for selectively driving pixel electrodes. The terminal of each signal driving circuit element is connected to the lead wire extended from the data line connecting with the drain electrode of the thin film transistor.

However, because the display driving circuit of the above existing liquid-crystal display device using IC chips is configured by installing several driving circuit elements consisting of IC chips on the glass substrate where display electrodes are formed, each of the above driving circuit elements must be connected to each lead wire arranged on the glass substrate. Therefore, it is complicated to manufacture the liquid-crystal display device. For the active-matrix-type liquid-crystal display device using a single crystal substrate, the operation speed of the display driving circuit is high because the transistors for selecting pixel electrodes and for the driver use the single-crystal MOS-type transistor. However, the liquid-crystal display device manufacturing cost is very high because high-purity single-crystal silicon substrate should be used for the substrate. Moreover, there is a problem that a large screen can hardly be made because it is difficult to manufacture single-crystal silicon substrate with a large area.

Meanwhile, the TFT active-matrix-type liquid-crystal display device can use inexpensive and large-area glass substrates because the transistors for selecting pixel electrodes and for a driver use a thin film transistor. Therefore, the liquid-crystal display device manufacturing cost can greatly be decreased. Moreover, it is possible to manufacture a large screen.

However, if the display driving circuit of the TFT active-matrix-type liquid-crystal display device is configured with thin film transistors using amorphous silicon as a semiconductor, high-speed display driving cannot be made because the operation speed of the display driving circuit decreases.

Therefore, for the TFT active-matrix-type liquid-crystal display device, it is preferable to use the thin film transistor using polycrystal silicon for the semiconductor layer. Because the thin film transistor using polycrystal silicon for the semiconductor layer has a higher operation speed than the transistor using amorphous silicon, the operation speed of the display driving circuit can be improved.

For the thin film transistor using the polycrystal silicon for the semiconductor layer, however, heat treatment should be executed to form the polycrystal silicon semiconductor layer by heating a deposited layer of amorphous silicon at a high temperature. Therefore, the substrate should be a heat-resistant substrate capable of standing the high temperature. The existing TFT active-matrix-type liquid-crystal display device comprises thin film transistors for a driver in which the display driving circuit is made at the end of the line lead-out portion of either glass substrate where the pixel electrode selecting thin-film transistors and pixel electrodes are formed. Therefore, to use the thin film transistor for a driver using polycrystal silicon for the semiconductor layer, the above glass substrate must be made of heat-resistant glass such as quartz glass. Because the heat-resistant glass is much more expensive compared with normal glass (e.g, soda-lime glass coated thereon with silicon dioxide film), the liquid-crystal display device manufacturing cost increases when the heat-resistant glass is used for the above glass substrate.

The present invention is made in view of the above situation and it is an object of the present invention to provide liquid-crystal display devices which have display driving circuits and can easily be manufactured at a low cost.

SUMMARY OF THE INVENTION

To achieve the above object, the liquid-crystal display device of this invention has:

a first substrate on which a plurality of first electrodes are arrayed;

a plurality of signal supplying lines which are electrically connected with the plurality of first electrodes, extended to the periphery of the first substrate, and formed on the first substrate so that a terminal portion will be provided with at least one end of the first electrode;

a second substrate disposed to be separated from the first substrate at a predetermined gap and having at least one second electrode arranged to oppose the first electrodes;

a sealing member arranged to enclose the area where the plurality of first electrodes inside the terminal portion on the first substrate are arrayed, and bonding the first substrate with the second substrate;

a liquid crystal material sealed in the area enclosed by the sealing member for the first and second substrates;

a heat-resistant sub-substrate;

a driving circuit block in which an input terminal for display control signal supplied from the outside, a driving circuit which is formed by connecting a plurality of thin-film transistors using semiconductor having crystal structure and generates the driving signal to be supplied to at least the first electrode according to the input display control signal; and connecting means for electrically connecting the output terminal of the driving circuit block with the terminal portion of the signal supplying lines formed on the first substrate.

According to the present invention with the above configuration, a liquid-crystal display device having a display driving circuit can be manufactured only by installing each output terminal arranging the drive elements at its one end on each driving circuit connecting terminal at the terminal arranged portion of the glass substrate. Therefore, it is easy to manufacture the liquid-crystal display device compared with the existing liquid-crystal display device in which the display driving circuit is configured by installing a plurality of driving circuit elements comprising IC chips on the glass substrate forming electrodes for display one by one.

In addition, because the display driving circuit comprising the thin-film transistor is less expensive than the IC chip obtained by forming many MOS-type transistors on a single-crystal silicon substrate, the display driving circuit cost can also greatly be decreased.

Moreover, in the present invention, the driving circuit of the driver element is configured by the thin film transistor using polycrystal-silicon semiconductor. The thin film transistor using the polycrystal-silicon semiconductor has higher operation speed than the thin film transistor using amorphous-silicon semiconductor. Therefore, the display driving circuit of the driver element can be operated at an adequately high speed as the display driving circuit of liquid-crystal display device. Also, because the polycrystal-silicon semiconductor is formed by treating it at a high temperature, the substrate of driver element should use heat-resistant glass substrate in order to configure the display driving circuit of the driver element by the thin-film transistor using polycrystal-silicon semiconductor. In the present invention, the substrate of driver element can use at least a small strip substrate with the length corresponding to the entire terminal arranged area of the glass substrate formed on the electrode for display. Therefore, the liquid-crystal display device manufacturing cost can be decreased because only a small amount of expensive heat-resistant glass is necessary and the large-area glass substrate for forming electrodes for display can be made by inexpensive normal glass substrate requiring no heat resistance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The first embodiment of the present invention is described below according to FIGS. 3 through 8.

Figure 3:
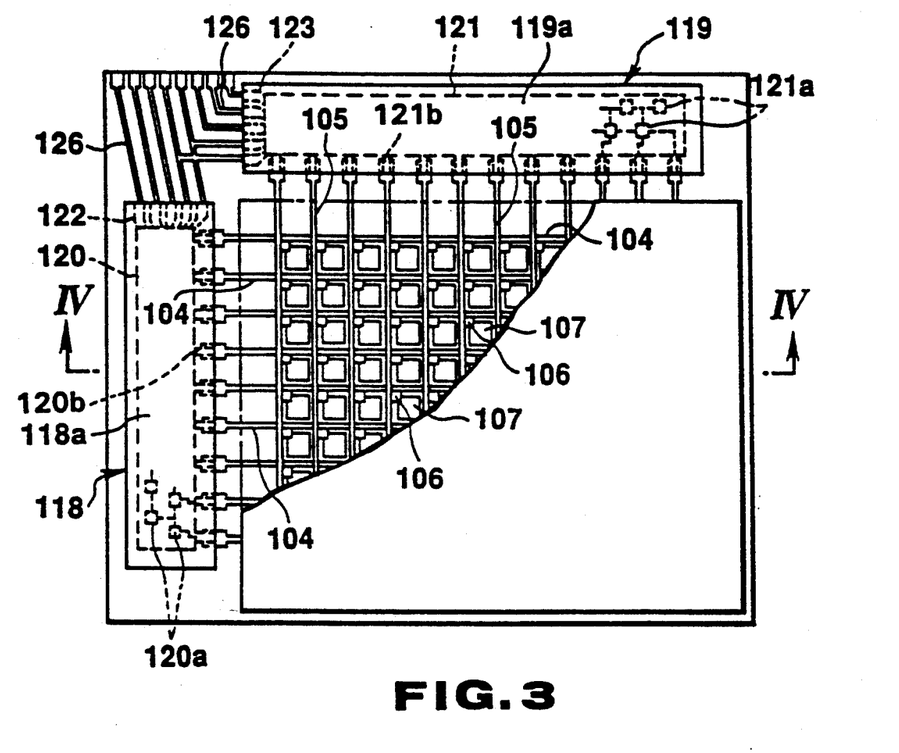
FIG. 3 is a top view of the first embodiment of this invention.
Figure 4:
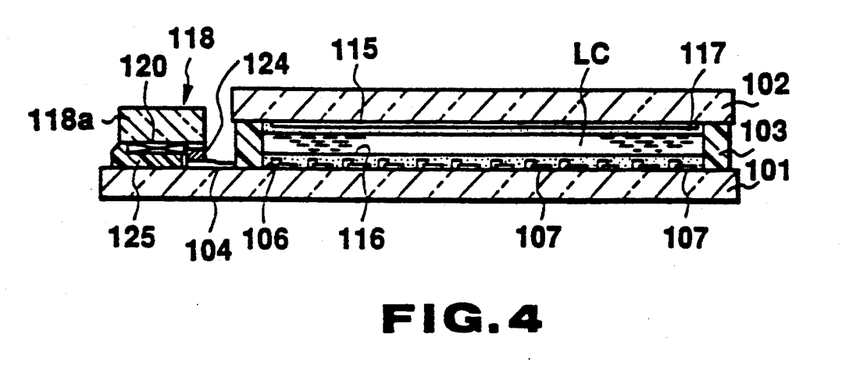
FIG. 4 is a sectional view of the liquid-crystal display device of the first embodiment along the line IV—IV in FIG. 3.
Figure 6:
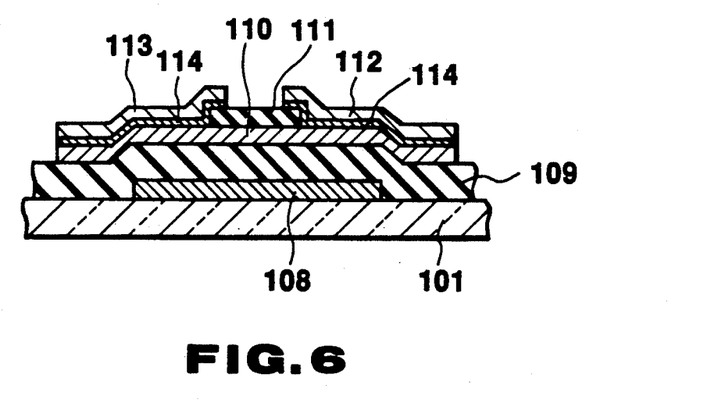
FIG. 6 is a sectional view showing the structure of a thin-film transistor used for the present invention.

FIGS. 3 and 4 show the configuration of the TFT active-matrix-type liquid-crystal display device of this embodiment, in which numerals 101 and 102 are a pair of glass substrates faced at both sides of the liquid crystal layer LC. These glass substrates 101 and 102 are made of normal glass substrate such as soda-lime glass coated thereon with silicon dioxide film. This pair of glass substrates 101 and 102 is bonded through the frame-shaped sealing member 103 enclosing the liquid crystal sealing area. A plurality of scanning lines 104 and a plurality of data lines 105 orthogonal to the scanning lines, a plurality of selecting thin-film transistors 106 for selecting the pixel electrode (hereafter referred to as pixel selecting TFT) which use amorphous silicon as their semiconductor layer and are arranged at each intersection of the scanning line 104 and data line 105, and plural pixel electrodes 107 each connected to one selecting TFTs 106 are formed on glass substrate (bottom substrate in the drawing) of the pair of glass substrates 101 and 102. The selecting TFT 106, as shown in FIG. 6, is made by laminating the gate electrode 108 connecting with the scanning line 104 arranged on the glass substrate 101, the gate insulating film 109 covering the gate electrode 108 and the scanning line 104, and the amorphous silicon semiconductor layer 110 formed on the gate insulating film 109 by facing with the gate electrode 108.

A blocking layer 111 comprising an insulating film is formed at the center of the semiconductor layer 110 to form a channel, and the source electrode 112 and drain electrode 113 are stacked at the both sides of the semiconductor layer 110 through a contact layer 114 comprising n+-type semiconductor made by doping impurities. The drain electrode 113 is connected to the data line 105 arranged on the gate insulating film 109 and the source electrode 112 is connected to the pixel electrode 107. The opposing electrode 115 which opposes each of the pixel electrodes 107 is formed on the other glass substrate 102 (upper substrate in the drawing). Moreover, the orientation films 116 and 117 are formed on the electrode forming surface of both glass substrates 101 and 102 respectively. Each scanning line 104 and each data line 105 arranged on the glass substrate 101 are extended to one end and side of the glass substrate 101.

The scanning driver element 118 is installed on the periphery of the scanning-line lead-out portion of the glass substrate 101 and the data driver element 119 is installed on the periphery of the data-line lead-out portion.

Figure 5:
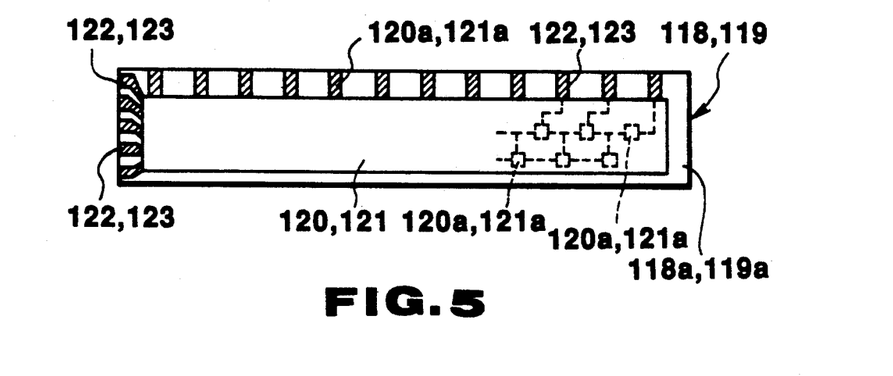
FIG. 5 is a schematic structural drawing of the driving circuit block shown in FIG. 3.

These driver elements 118 and 119, as shown in FIGS. 3 through 5, respectively form many thin-film transistors 120a and 121a (hereinafter referred to as TFT for driver) using polycrystal silicon as the semiconductor layer on the substrates 118a and 119a comprising heat-resistant glass such as quartz glass to form the display driving circuits 120 and 121. The TFTs for driver 120a and 121a have the same structure as the pixel selecting transistor 106 shown in FIG. 6, which are formed by stacking the gate electrode, gate insulating film, polycrystal-silicon semiconductor layer opposing the gate electrode through the gate insulating film, source electrode, and drain electrode.

The polycrystal-silicon semiconductor layer is made by polymerizing the deposited layer of amorphous silicon at a high temperature. Therefore, the substrates 118a and 119a should be made of heat-resistant glass capable of standing the heat treatment to polymerize the amorphous silicon.

The driver elements 118 and 119 should be made of a strip element slightly longer than the line terminal arranged area at the scanning- and data-line lead-out ends of the glass substrate 101, which are installed on the line lead-out end of the glass substrate 101 by connecting output terminals 120b and 121b extended from the display driving circuit 120 and 121 to one side of the substrates 118a and 119a with the terminal portion 104a, 105a of each scanning line 104 and each data line 105 by solder or conductive anisotropic adhesive. In FIG. 4, the driver elements 118 and 119 and the glass substrate 101 are secured by the driver element securing resin 125 filled up between the elements and the glass substrate.

Several input terminals 122 and 123 are formed on one end of the substrates 118a and 119a of the driver elements 118 and 119 respectively, which are connected with the external-circuit connecting wires 126 arranged on the corner of the glass substrate 101 by solder or the like.

Figure 7:
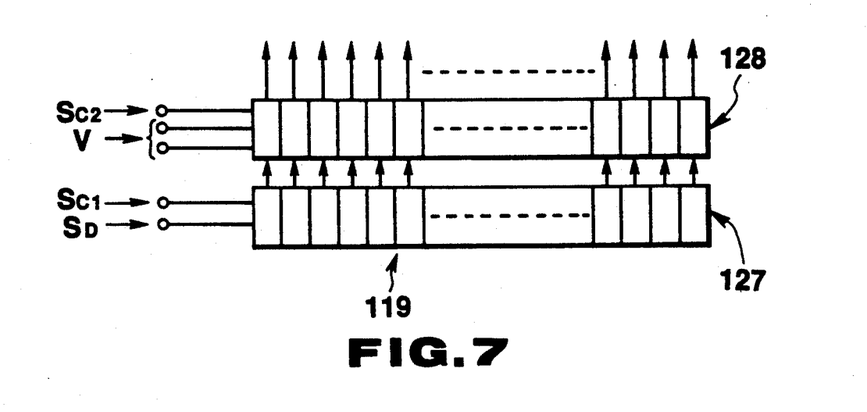
FIG. 7 is a schematic block diagram showing the circuit configuration of the driving circuit block shown in FIG. 3.

FIG. 7 is a block diagram of the display driving circuit 121 formed on the substrate 119a. The display driving circuit 121 comprises shift registers 127 of stages equal to the number of data lines of the liquid-crystal display device and level shifters 128 of stages equal to the number of the shift registers 127. The shift register 127 sequentially takes in the binary display data signal $S_D$ input from an external circuit synchronously with the shift clock Sc1. The display data for one scanning line taken in the final stage of the shift register 127 is sent from the shift register 127 to the level shifter 128 synchronously with the synchronizing clock Sc2 (scanning timing signal) input to the level shifter 128 from the external circuit. The level shifter 128 converts the display data for one scanning line into ON-level (high level) and OFF-level (low level) driving signals corresponding to the voltage V of the power source (binary, power source) and outputs the signals to each data line 105.

Figure 8:
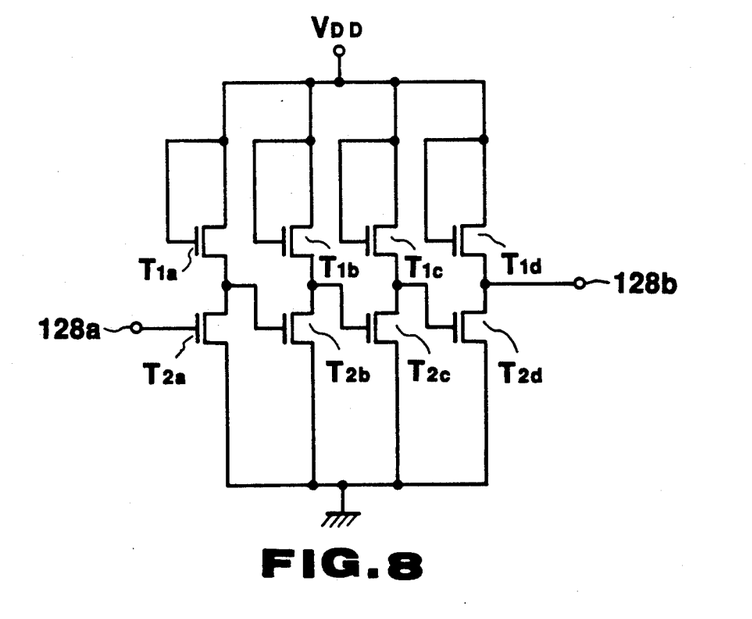
FIG. 8 is a circuit block diagram showing some circuits of the circuit diagram shown in FIG. 7.

The level shifter 128 has a parallel-connection circuit of the inverter circuit shown in FIG. 8 and a holding circuit (not illustrated) for reading or outputting the display data sent from the shift register 127 synchronously with the synchronizing clock.

For the parallel-connection circuit of the inverter circuit in FIG. 8, the supply voltage $V_{DD}$ is applied to the drain electrode and inverters of several stages (e.g. four stages) comprising a load transistor $T_{1a}$ made of TFT shorted between the drain and gate electrodes and a driver transistor $T_{2a}$ made of TFT whose drain electrode is connected to the source electrode of the load transistor $T_{1a}$ and whose source electrode is grounded are connected in parallel. The input terminal 128a is connected to the gate electrode of the driver transistor $T_{2a}$ at the first stage and the drain electrode of the driver transistor $T_{2a}$ is connected to the gate electrode of the driver transistor $T_{2a}$ at the second stage as the output terminal of the first-stage inverter. Similarly, the drain electrode of the second-stage driver transistor $T_{2b}$ is connected to the gate electrode of the third-stage driver transistor $T_{2c}$, the drain electrode of the third-stage driver transistor $T_{2c}$ to the gate electrode of the fourth-stage driver transistor $T_{2d}$, and the drain electrode of the fourth-stage driver transistor $T_{2b}$ to the drain line 105 or gate line 104 as the output terminal 128b of the inverter circuit.

The display driving circuit 120 formed on the substrate 118a comprises, though not illustrated, shift registers of stages equal to the number of scanning lines of the liquid-crystal display device and level shifters of stages equal to the number of the shift registers similarly to the display driving circuit 121 of the data driver element 119. The display driving circuit 120 of the scanning driver element 118 sequentially outputs an ON signal (gate signal to turn on the pixel selecting TFT 106) to each scanning line 104. For the display driving circuit 120 of the scanning driver element 118, the basic operations are the same as those of the display driving circuit 121 of the data-side driver element 119 except the fact that a scanning-line selecting signal is input to the shift register instead of a display data signal.

Thus, for the liquid-crystal display device of the embodiment, the operation speed of the display driving circuits 120 and 121 of the scanning driver element 118 and data driver element 119 can be improved because they are configured by the driver TFTs 120a and 121a having a high operation speed using polycrystal silicon for the semiconductor layer.

Moreover, for the liquid-crystal display device, the driver TFTs 120a and 121a composing the display driving circuits 120 and 121 are formed on the substrates 118a and 119a which are different from the glass substrate 101 where the selecting TFT 106 and pixel electrode 107 are formed. The driver elements 118 and 119 composing the display driving circuits 120 and 121 are installed on the line lead-out end of the glass substrate 101 forming the pixel selecting TFT 106 and pixel electrode 107 and the pixel selecting TFT 106 uses amorphous silicon for the semiconductor layer. Therefore, the glass substrate 101 forming the pixel selecting TFT 106 and pixel electrode 107 can be made of normal glass (e.g. soda-lime glass coated thereon with silicon dioxide film) which is inexpensive and requires no heat resistance. Also, the substrates 118a and 119a of the driver elements 118 and 119 which should be made of heat-resistant glass such as quartz glass only require a substrate with the minimum area capable of forming the display driving circuits 120 and 121. Therefore, consumption of the expensive heat-resistant glass can be minimized and the liquid-crystal display device manufacturing cost can be decreased.

The liquid-crystal display device uses glass for the substrates 118a and 119a of the driver elements 118 and 119 and for the substrate 101 forming the selecting TFT 106 and pixel electrode 107. The substrates 118a and 119a and the substrate 101 have almost same thermal expansion coefficient though they are different in heat resistance. Therefore, though the driver elements 118 and 119 made by forming display driving circuits 120 and 121 on the substrates 118a and 119a different from the glass substrate 101 are installed on the glass substrate 101 on which the pixel selecting TFT 106 and the pixel electrode 107 are formed, the driver elements 118 and 119 are not separated from the glass substrate 101 due to expansion or contraction caused by temperature change.

In the above embodiment, the scanning driver element 118 and the data driver element 119 are made of a strip element slightly longer than the length of the line terminal arranged area at the scanning- and data-line lead-out ends of the glass substrate 101 where the pixel selecting TFT 106 and the pixel electrode 107 are formed. However, it is also possible to divide the driver elements 118 and 119 into several pieces respectively and arrange the divided element pieces on the line lead-out portion of the glass substrate 101.

The second embodiment of the present invention is described below in detail.

Figure 9:
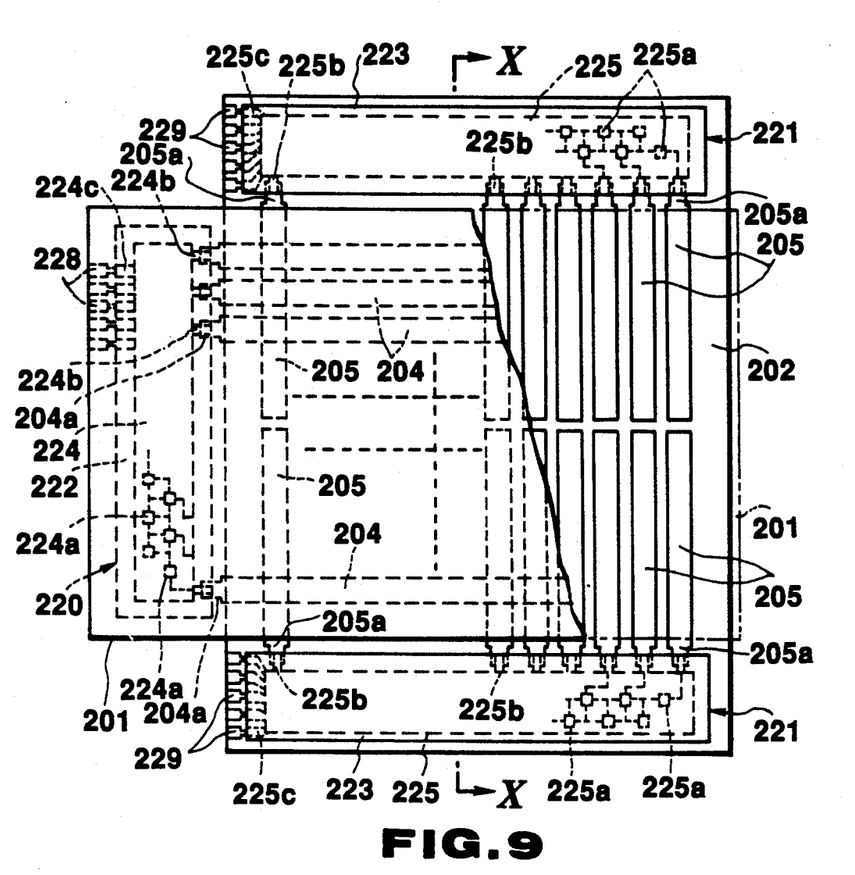
FIG. 9 is a top view showing the second embodiment of the present invention.
Figure 10:
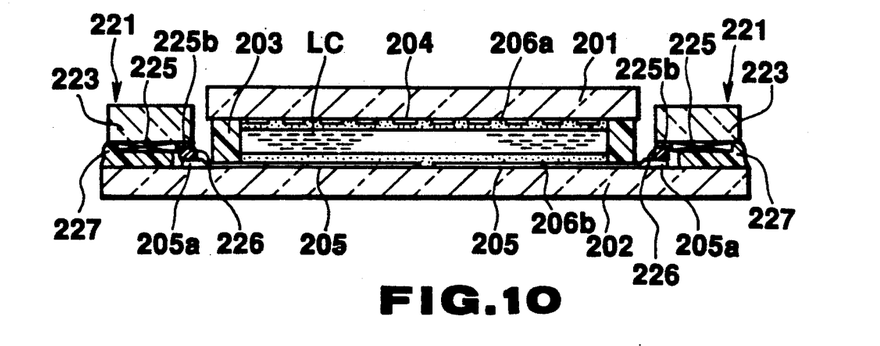
FIG. 10 is a sectional view of the liquid-crystal display device of the second embodiment along the line X—X in FIG. 9.

FIGS. 9 and 10 show the configuration of the liquid-crystal display device of the second embodiment of the present invention. The liquid-crystal display device of the second embodiment is the simple matrix type. In FIGS. 9 and 10, numerals 201 and 202 are a pair of glass substrates opposed at both sides of the liquid crystal layer LC and the glass substrates 201 and 202 should be made of normal glass such as soda-lime glass coated thereon with silicon dioxide film where silicon dioxide film is formed on the surface of soda-lime glass.

This pair of glass substrates 201 and 202 are bonded through the frame-shaped sealing member 203 enclosing the liquid crystal sealing area. A plurality of striped scanning electrodes (transparent electrodes) 204 are formed in parallel on the glass substrate 201 (upper substrate in the drawing) of the pair of glass substrates 201 and 202, and a plurality of striped signal electrodes (transparent electrodes) orthogonal to the scanning electrodes 204 are formed in parallel on the glass substrate 202 (lower substrate in the drawing). In addition, the orientation films 206a and 206b are formed on the electrode forming surface of the substrates 201 and 202 respectively. For the liquid-crystal display device of this embodiment, the signal electrodes 205 are disconnected at the middle of the longitudinal length so that each signal electrode 205 will independently be driven in order to decrease the display driving duty ratio.

The end of each scanning electrode 204 formed on the glass substrate 201 is extended to the terminal arranged portion at the end of the glass substrate 201 to form the scanning driving circuit connecting terminal 204a. The end of each signal electrode 205 formed on the substrate 202 is extended to the terminal arranged portion at both ends of the glass substrate 202 to form the signal driving circuit connecting terminal 205a. Each scanning driving circuit connecting terminal 204a is arranged in one line along the terminal arranged portion of the glass substrate 201 and each signal driving circuit connecting terminal 20a is arranged in one line along each terminal arranged portion of the glass substrate 202.

Meanwhile, numeral 220 is a scanning driver element installed at the terminal arranged portion of the glass substrate 201 and numeral 221 is a signal driver element installed on each terminal arranged portion of the glass substrate 202.

The driver elements 220 and 221, as shown in FIGS. 9 and 10, are made by forming many thin-film transistors 224a and 225a using polycrystal silicon for the semiconductor layer (hereafter referred to as driver TFT) on the strip substrates 222 and 223 slightly longer than the terminal arranged area at the terminal arranged end of the glass substrate 202 to configure the scanning driving circuit 224 and signal display driving circuit 225. Each driver TFT 224a and 225a has the same structure as that in FIG. 6, which is configured by stacking a gate electrode, gate insulating film, and polycrystal-silicon semiconductor layer opposing the gate electrode through the gate insulating film, source electrode, and drain electrode. The polycrystal-silicon semiconductor layer is made by polymerizing the deposited layer of amorphous silicon at a high temperature. Therefore, the substrates 222 and 223 should be made of heat-resistant glass such as quartz glass capable of standing heat treatment to polymerize the amorphous silicon.

The scanning driver element 220 is installed on the terminal arranged portion of the glass substrate 201 by connecting each output terminal 224a extended from the driving circuit 224 to one end of the substrate 222 to each scanning driving circuit connecting terminal 204a on the glass substrate 201 where the scanning electrode 204 is formed. Each signal driver element 221 is installed on each terminal arranged portion of the glass substrate 202 by connecting each output terminal 225a extended from the display driving circuit 225 to one end of the glass substrate 202 where the signal electrode 205 is formed to each signal driving circuit connecting terminal 205a on the glass substrate 202. The output terminals 224b and 225b of the scanning and signal driver elements 220 and 221 are arranged at the pitch corresponding to the arrangement pitch of the driving circuit connecting terminals 204a and 205a, and the output terminal 225b is connected to the driving circuit connecting terminal 205a by solder 226 or the like. In FIG. 10, numeral 227 is driver element securing resin filled up between the driver element 220 and the glass substrate 201 and between the driver element 221 and the glass substrate 202.

Also, a plurality of input terminals 224c and 225c extended from the display driving circuits 224 and 225 are formed on a part of the other end of the substrate 222 of the scanning driver element 220 and on one end of the substrate 223 of each signal driver element 221 respectively. The input terminals 224c and 225c are connected by solder or the like to the external-circuit connecting wires 228 and 229 arranged on the glass substrate 201 where the scanning electrode 204 and signal electrode 205 are formed.

The display driving circuits 224 and 225 have the configuration and action almost the same as those of the first embodiment previously mentioned. Therefore, the description is omitted.

For the liquid-crystal display device of the second embodiment, the scanning and signal display driving circuits 224 and 225 are configured by forming a plurality of driver TFTs 224a and 225a on the strip substrates 222 and 223 different from the glass substrates 201 and 202 where the display scanning electrode 204 and signal electrode 205 are formed and installing the scanning-side driver element 220 composing the scanning display driving circuit 224 and the signal-side driver element 221 composing the signal display driving circuit 225 on the terminal arranged portion of the glass substrates 201 and 202 respectively.

According to the embodiment, a liquid-crystal display device having a display driving circuit can be manufactured only by connecting the output terminals 224b and 225b to the driving circuit connecting terminals 204b and 205b at the terminal arranged portion of the glass substrates 201 and 202 respectively to install the driver elements 220 and 221. Therefore, the liquid-crystal display device can easily be manufactured compared with the existing liquid-crystal display device which configures a display driving circuit by installing several driving circuit elements comprising IC chips one by one on glass substrates where display electrodes are formed. Moreover, the display driving circuits 224 and 225 comprising the driver TFTs 224a and 225a are much less expensive than the IC chip where many MOS-type transistors are formed on a single-crystal silicon substrate. Therefore, the cost for the display driving circuits 224 and 225 can greatly be decreased.

For the liquid-crystal display device of this embodiment, polycrystal-silicon semiconductor is used for the driver TFTs 224a and 225a composing the display driving circuits 224 and 225 of the driver elements 220 and 221. The TFT using the polycrystal-silicon semiconductor has higher operation speed than that of the TFT using amorphous-silicon semiconductor though its operation speed is not higher than that of the MOS-type transistor using single-crystal substrate. Therefore, the display driving circuit of the driver elements 220 and 221 can be operated at an adequately high speed as display drivers of liquid-crystal display device. The polycrystal-silicon semiconductor is formed through heat treatment at a high temperature. Therefore, the substrates 222 and 223 of the driver elements 220 and 221 should use heat-resistant glass such as quartz glass in order to configure the display driving circuits 224 and 225 of the driver elements 220 and 221 with TFTs 224a and 225a using polycrystal-silicon semiconductor. However, the substrates 222 and 223 of the driver elements 220 and 221 use only a small amount of expensive heat-resistant glass because the substrates can be made of a strip substrate slightly longer than the length of the terminal arranged area of the glass substrates 201 and 202 where the display scanning electrode 204 and signal electrode 205 are formed. Also, the large-area glass substrates 201 and 202 forming the display electrode (scanning electrode 204 and signal electrode 205) can be made of inexpensive normal glass (e.g. soda-lime glass coated thereon with silicon dioxide film). Thus, the liquid-crystal display device manufacturing cost can be decreased.

For the above liquid-crystal display device, the substrates 222 and 223 of the driver elements 220 and 221 are made of glass. The substrates 222 and 223 and the glass substrates 201 and 202 forming the display electrodes 204 and 205 have almost same thermal expansion coefficient though they are different in heat resistance. Therefore, the driver elements 220 and 221 are not separated from each other due to expansion or contraction caused by temperature change though the driver elements 220 and 221 made by composing the display driving circuits 224 and 225 on the strip substrates 222 and 223 slightly longer than the length of the terminal arranged area are installed on the glass substrates 201 and 202 where the display electrodes 204 and 205 are formed.

In the above embodiment, the ends of the scanning electrode 204 and signal electrode 205 are used for the driving circuit connecting terminals 204a and 205a respectively. However, the driving circuit connecting terminals 204a and 205a can be formed on the ends of lead wires extended from the scanning electrode 204 and signal electrode 205 respectively. In this case, it is also possible to arrange driving circuit connecting terminals 204a and 205a at a pitch different from the arrangement pitch of the scanning electrode 204 and signal electrode 205. The length of the substrates 222 and 223 of the driver elements 220 and 221 can be optional as long as it corresponds to the entire length of the terminal arranged area of the glass substrates 201 and 202 where display electrodes scanning electrode 204 and signal electrode 205) are formed. However, it is preferable to keep the length of the substrates 222 and 223 of the driver elements 220 and 221 so that the substrates will not extend beyond the glass substrates 201 and 202 where the display electrodes are formed.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A liquid-crystal display device having a driving circuit, comprising:
   a first substrate on which a plurality of first electrodes are arrayed, sad first substrate having substantially no heat resistance property;
   a plurality of signal supplying lines electrically connected with said plurality of first electrodes on said first substrate and extending to a periphery of said first substrate, said signal supplying lines having terminal portions installed on at least one end thereof in order to supply driving signals to said first electrodes;
   a second substrate having substantially no heat resistance property and separated from said first substrate with a predetermined gap therebetween, sad second substrate having at least one second electrode arranged to oppose said first electrodes;
   sealing means for enclosing a region containing said plurality of first electrodes inside the terminal portions on said first substrate, and for bonding said first substrate with said second substrate;
   a liquid crystal material sealed in the region enclosed by said first substrate, second substrate, and sealing means;
   heat-resistant sub-substrate having a smaller area than that of said first substrate and connected to the periphery of said first substrate;
   a driving circuit block having
      input terminals for receiving a display control signal supplied from the outside,
      driving circuit means for generating the driving signals to be supplied to at least said first electrodes according to the inputted display control signal, said driving circuit means including formed on said sub-substrate and including a plurality of thin-film transistors connected together, said transistors comprised of a semiconductor having a crystal structure, and
      output terminals for outputting the driving signal from said driving circuit means,
      said input terminals, said driving circuit, and said output terminals being mounted on said sub-substrate; and
   connecting means for electrically connecting each output terminal of said driving circuit block with each terminal portion of said signal supplying lines formed on said first substrate.

2. A liquid-crystal display device according to claim 1, wherein said first substrate comprises soda lime glass and the silicon-dioxide film formed on the glass surface.

3. A liquid-crystal display device according to claim 1, wherein the semiconductor of each said transistor has a polycrystal structure.

4. A liquid-crystal display device according to claim 3, wherein the semiconductor having said polycrystal structure is made of silicon.

5. A liquid-crystal display device according to claim 1, wherein said sub-substrate is made of quartz glass.

6. A liquid-crystal display device according to claim 1, wherein said connecting means comprises a means for securing said sub-substrate onto said first substrate so that each output terminal of said sub-substrate will electrically be connected with each signal supplying terminal.

7. A liquid-crystal display device according to claim 6, wherein said connecting means has an electrical connecting means for electrically connecting each output terminal of the sub-substrate with said signal supplying terminal corresponding to the output terminal and a means for securing said sub-substrate onto the said first substrate.

8. A liquid-crystal display device having a driving circuit, comprising:

a first substrate on which a plurality of first electrodes are arrayed in a stripe-like manner, said first substrate having substantially no heat resistance property;

a plurality of first terminals electrically connected with said plurality of first electrodes on the first substrate and extending to a periphery of said first substrate in order to supply driving signals to the first electrodes;

a second substrate having substantially no heat resistance property and separated from said first substrate with a predetermined gap therebetween, said second substrate having a plurality of second electrodes which are arranged in a stripe-like manner in a direction approximately orthogonal to said first electrodes;

a plurality of second terminals arranged on a peripheral portion of said second substrate, and electrically connected with said plurality of second electrodes in order to supply driving signals to the second electrodes;

sealing means for enclosing a region containing said plurality of first electrodes which oppose said second electrodes, inside the first terminals on said first substrate and also inside the second terminals on said second substrate, and for bonding said first substrate with said second substrate;

a liquid crystal material sealed in the region enclosed by said first substrate, second substrate, and sealing means;

a heat-resistant sub-substrate having a smaller area than that of said first substrate and connected to the periphery of said first substrate;

a driving circuit block having driving circuit means for generating the driving signals to be supplied to at least one of said first and second electrodes according to an input display control signal, said driving circuit means formed on said sub-substrate and including a plurality of input terminals for receiving the display control signal supplied from the outside and a plurality of thin-film transistors connected with said input terminals, said transistors comprised of a semiconductor having a crystal structure and output terminals for outputting the driving signals; and connecting means for electrically connecting the output terminals of said driving circuit block with at least one of said first and second terminals formed on said first and second substrates.

9. A liquid-crystal display device according to claim 8, wherein said first and second substrates comprise soda lime glass and silicon dioxide film formed on the surface of the glass and said sub-substrate is made of quartz glass, and the semiconductor of said transistor has a polycrystal structure.

10. A liquid-crystal display device according to claim 9, wherein the semiconductor having said polycrystal structure is made of silicon.

11. A liquid-crystal display device having a driving circuit, comprising:

a first substrate on which a plurality of first electrodes are arrayed, said first substrate having substantially no heat resistance property;

active elements arranged on said first substrate, and connected to said first electrodes respectively;

a plurality of signal supplying lines electrically connected with said active elements on said first substrate and extending to a periphery of said first substrate, said signal supplying lines having terminal portions formed on at least one end thereof in order to supply driving signals to said first electrodes;

a second substrate having substantially no heat resistance property and separated from said first substrate with a predetermined gap therebetween, said second substrate having at least one second electrode arranged to oppose the first electrodes;

sealing means for enclosing a region containing said plurality of first electrodes inside the terminal portions of said first substrate, and for bonding said first substrate with said second substrate;

a liquid crystal material sealed in the region enclosed by said first substrate, second substrate, and sealing means;

a heat-resistant sub-substrate having a smaller area than that of said first substrate and connected to the periphery of said first substrate;

a driving circuit block having:

driving circuit means for generating the driving signals to be supplied to at least said first electrode according to an input display control signal, said driving circuit means formed on said sub-substrate and including a plurality of input terminals for receiving the display control signal supplied from the outside and a plurality of thin-film transistors connected with said input terminals, said transistors comprised of a semiconductor having a crystal structure and, output terminals for outputting the driving signals; and connecting means for electrically connecting each output terminal of said driving circuit block with each terminal portion of said signal supplying lines formed on said first substrate.

12. A liquid-crystal display device according to claim 11, wherein the semiconductor of said transistor a polycrystal structure.

13. A liquid-crystal display device according to claim 12, wherein the semiconductor having said polycrystal structure is made of silicon.

14. A liquid-crystal display device according to claim 11, wherein said first and second substrates comprise soda lime glass and silicon dioxide film formed on the surface of the glass and said sub-substrate is made of quartz glass, and the semiconductor of said transistor a polycrystal structure.

15. A liquid-crystal display device according to claim 11, wherein said active element has a semiconductor film made of amorphous silicon.

16. A liquid-crystal display device according to claim 11, wherein the active element formed on said first substrate comprises thin-film transistors.

17. A liquid-crystal display device according to claim 16, wherein said thin-film transistor has a semiconductor film made of amorphous silicon.

18. A liquid-crystal display device according to claim 11, wherein each said active element comprises a thin-film transistor having a source electrode, a drain electrode and a gate, said source electrode being connected to each said first electrode, each said signal supplying line comprises a drain line which is connected to the drain electrode of the thin-film transistor and to which a scanning signal of the display control signal is supplied and a gate line which is connected to the gate electrode of the thin-film transistor and to which a scanning signal for sequentially selecting said first electrode of said display control signal is supplied, said thin-film transistor which is connected to said first electrode uses amorphous silicon as a semiconductor film, and said thin-film transistors of said driving circuit use polycrystal silicon as a semiconductor film.

19. A liquid-crystal display device according to claim 18, wherein said driving circuit means comprises
    data signal generation circuit means for generating a data signal corresponding to display data from said display control signal of the drain line connected to said drain electrode, and
    scanning signal generation circuit means for generating a scanning signal to sequentially select each gate line connected to said gate electrodes of said thin-film transistors.

20. A liquid-crystal display device according to claim 18, wherein said data signal generation circuit means and said scanning signal generation circuit means are formed on different sub-substrates respectively and each sub-substrate is secured on the first substrate.

* * * * *

UNITED STATES PATENT AND TRADEMARK OFFICE
CERTIFICATE OF CORRECTION

PATENT NO. : 5,200,847

DATED : April 6, 1993

INVENTOR(S) : Atsushi Hawatari

It is certified that error appears in the above-identified patent and that said Letters Patent is hereby corrected as shown below:

Title page, Section [54] Title, line 3, "SUB-" before the word "SUBSTRATE" should be deleted.

Signed and Sealed this

Eighth Day of March, 1994

Attest:

BRUCE LEHMAN

Attesting Officer

Commissioner of Patents and Trademarks